United States Patent
Nishimura

(10) Patent No.: US 7,358,653 B2
(45) Date of Patent: Apr. 15, 2008

(54) PIEZOELECTRIC ELEMENT

(75) Inventor: Toshio Nishimura, Yasu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 11/798,460

(22) Filed: May 14, 2007

(65) Prior Publication Data

US 2007/0236108 A1  Oct. 11, 2007

Related U.S. Application Data

(63) Continuation of application No. PCT/JP2006/321640, filed on Oct. 30, 2006.

(30) Foreign Application Priority Data

Nov. 2, 2005 (JP) ............................. 2005-319020

(51) Int. Cl.
*H01L 41/083* (2006.01)
(52) U.S. Cl. ...................... 310/340; 310/366
(58) Field of Classification Search ............. 310/328, 310/340, 366
See application file for complete search history.

(56) References Cited

U.S. PATENT DOCUMENTS

| 5,406,164 A * | 4/1995 | Okawa et al. | 310/366 |
| 2001/0009344 A1* | 7/2001 | Furukawa et al. | 310/358 |

FOREIGN PATENT DOCUMENTS

| JP | 56-160198 | 12/1981 | |
| JP | 60-249877 | 12/1985 | |
| JP | 62-88382 | * 4/1987 | ............ 310/328 |
| JP | 03-012974 | 1/1991 | |
| JP | 05-075175 | 3/1993 | |
| JP | 2003-017768 | 1/2003 | |
| JP | 2004-208452 | 7/2004 | |
| JP | 2005-086110 | 3/2005 | |
| WO | PCT/JP2006/321640 | 10/2006 | |

OTHER PUBLICATIONS

International Search Report dated Nov. 2, 2005.

* cited by examiner

*Primary Examiner*—Thomas M. Dougherty
(74) *Attorney, Agent, or Firm*—Dickstein Shapiro LLP

(57) ABSTRACT

Provided is a piezoelectric element including a monolithic piezoelectric substrate that can prevent not only migration between internal electrodes, but also deterioration resulting from a decrease in the degree of polarization even when temperature changes are repeatedly applied to the piezoelectric element. A piezoelectric element 1, in which a first external electrode 4 and a second external electrode 5 are formed on a first side face 2c and a second side face 2d, respectively, of a monolithic piezoelectric substrate 2 including first internal electrodes 3b and 3d placed at a first electric potential and second internal electrodes 3a, 3c and 3e placed at a second electric potential, which is different from the first electric potential, stacked with piezoelectric layers interposed therebetween, and exterior portions 6 and 7 for preventing migration are provided to cover a third side face 2e and a fourth side face 2f. The exterior portions 6 and 7 contain dispersed electroconductive particles and can prevent not only migration between adjacent internal electrodes, but also a decrease in the degree of polarization resulting from the pyroelectric effect.

20 Claims, 10 Drawing Sheets

FIG. 5
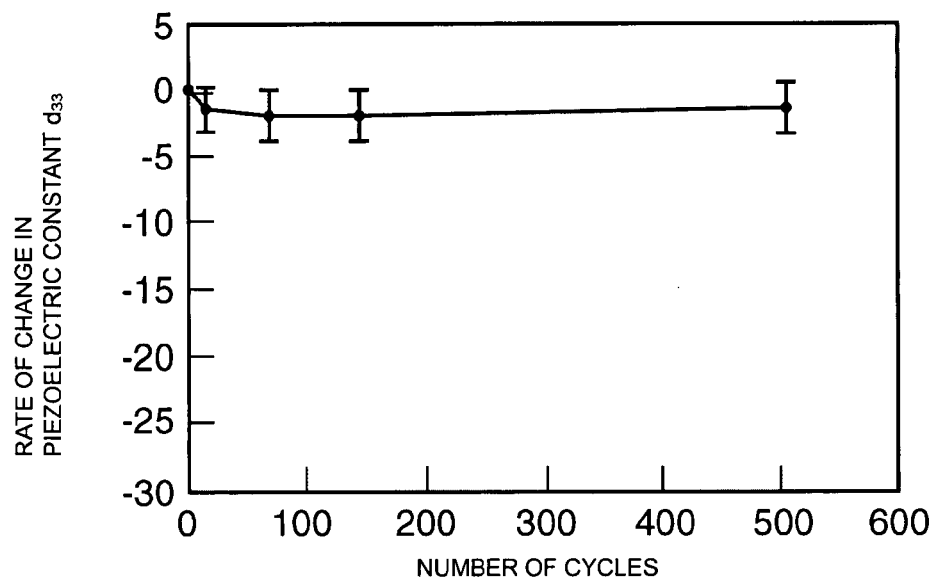
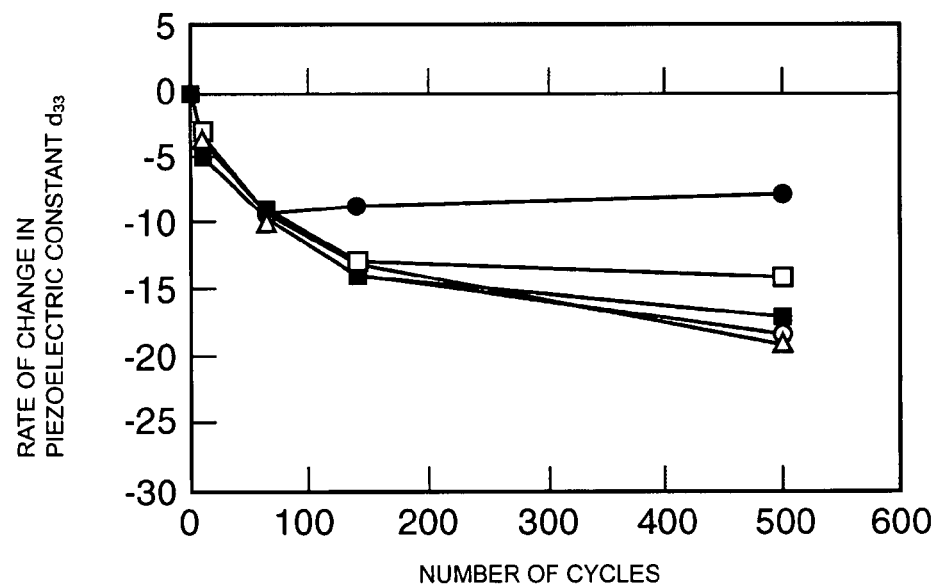
FIG. 6

FIG. 12A
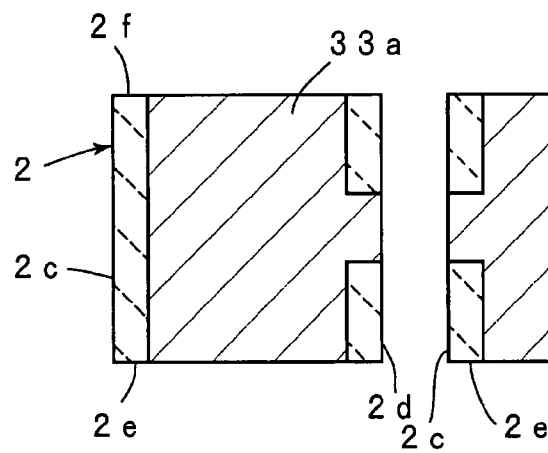
FIG. 12B
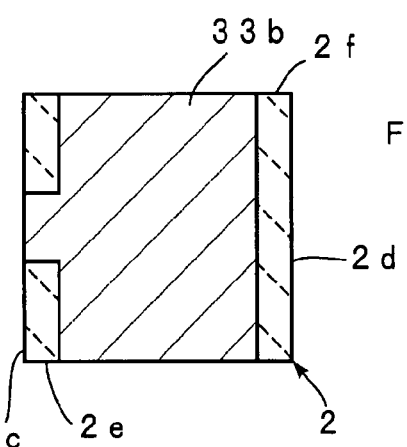
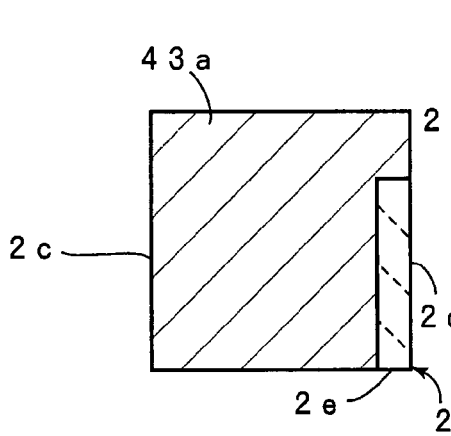
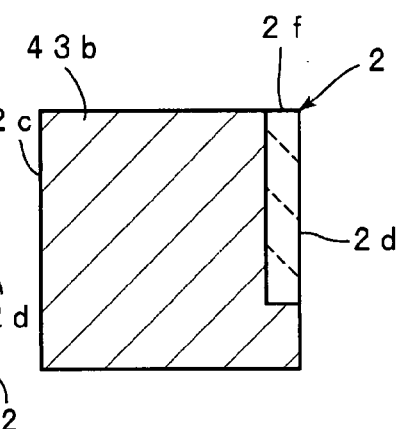
FIG. 13A
FIG. 13B

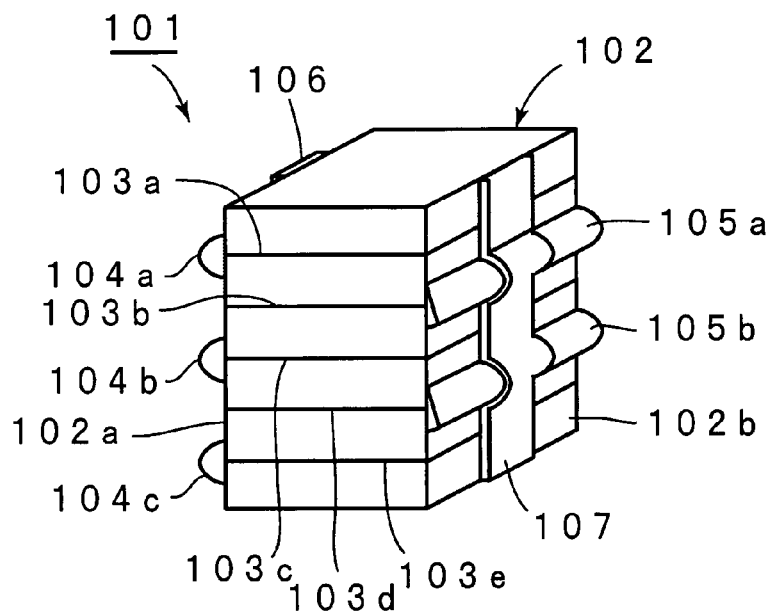
FIG. 15 - PRIOR ART
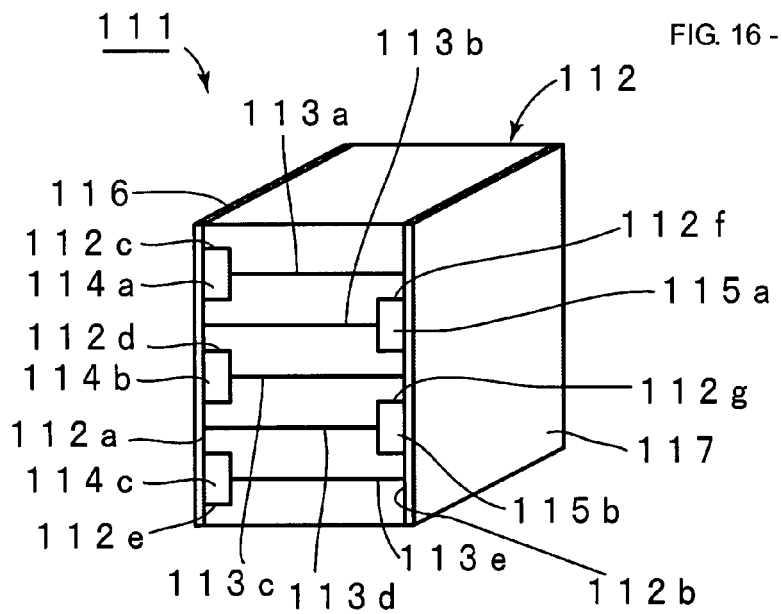
FIG. 16 - PRIOR ART

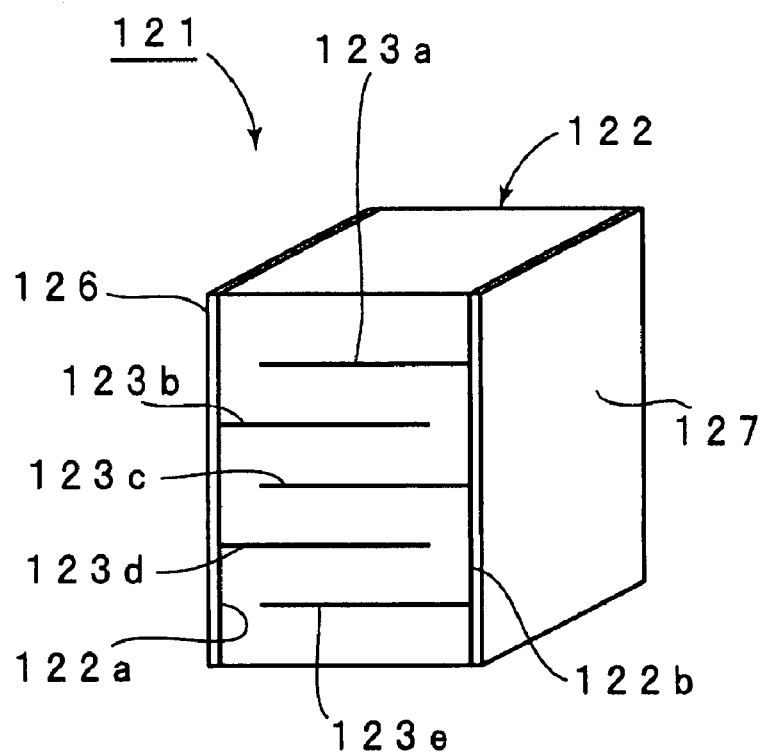
FIG. 17 - PRIOR ART ed electrode 116 and the second external electrode 117 to expand or contract the piezoelectric layers in the thickness direction, thus operating the actuators.

A prior art piezoelectric actuator illustrated in FIG. 17 is also known as a monolithic piezoelectric actuator. A piezoelectric actuator 121 includes a monolithic piezoelectric substrate 122. The piezoelectric substrate 122 includes a plurality of internal electrodes 123a to 123e alternately stacked in the thickness direction. Internal electrodes 123a, 123c and 123e protruding from a second side face 122b do not reach a first side face 122a. Internal electrodes 123b and 123d protruding from the first side face 122a do not reach the second side face 122b. Thus, a voltage can be applied to external electrodes 126 and 127 formed on the side faces 122a and 122b to operate the actuator.

In the piezoelectric actuators 101, 111 and 121, internal electrodes 103a to 103e, 113a to 113e, and 123a to 123e are exposed at side faces of the piezoelectric substrate 102, 112 and 122 on which external electrodes are not formed. Thus, when adjacent internal electrodes in the thickness direction are at different electric potentials, migration between the adjacent internal electrodes may occur on the exposed side faces of the piezoelectric substrates 102, 112 and 122.

In these situations, Patent Document 1 proposes a structure in which all the side faces of the piezoelectric substrate are coated with an exterior resin to cover the monolithic piezoelectric substrate 102, in other words, to cover not only portions on the side faces of the piezoelectric substrate 102 at which the internal electrodes 103a to 103e are exposed, but also the first external electrode 106 and the second external electrode 107. In the monolithic piezoelectric substrate 102, each of the first external electrode and the second external electrode have a lead wire. Except for the portions from which the lead wires are drawn, all the side faces of the piezoelectric substrate are covered with an exterior resin.

The exterior resin contains 800 ppm or less of alkali metal and/or alkali earth metal. Since the content of alkali metal and/or alkali earth metal is 800 ppm or less, Patent Document 1 states that the concentration of the alkali metal ion and/or the alkali earth metal ion at the edges of the internal electrodes on the negative electrode side is prevented and the migration is prevented. The resin material containing the alkali metal and/or the alkali earth metal is said to be preferably a fluorocarbon resin or a silicone resin.

Patent Document 2 proposes a structure in which a covering layer is formed to cover the side faces of the piezoelectric substrate 112 of the piezoelectric actuator 111 to prevent migration. Also in Patent Document 2, lead wires are connected to the first external electrode 116 and the second external electrode 117. The covering layer is formed on the side faces other than the portions from which the lead wires are drawn. The covering layer may be formed of at least one selected from the group consisting of copper oxides, nickel oxides, tin oxides, zinc oxides, chromium oxides and iron oxides. It is said that the covering layer provides electrical insulation and can thereby prevent migration.

Patent Document 3 discloses a circuit in which an electric charge leakage means is connected, as an additional component, to electrodes of a piezoelectric actuator placed at different electric potentials. Patent Document 3 states that the electric charge leakage means can prevent a decrease in the degree of polarization of the piezoelectric substrate because of the pyroelectric effect.

Patent Document 1: Japanese Unexamined Patent Application Publication No. 3-12974

Patent Document 2: Japanese Unexamined Patent Application Publication No. 2003-17768

Patent Document 3: Japanese Unexamined Patent Application Publication No. 60-249877

DISCLOSURE OF INVENTION

In a piezoelectric element including a monolithic piezoelectric substrate, piezoelectric layers are disposed on both sides of each internal electrode, as in the piezoelectric actuators 101, 111, and 121. In general, a piezoelectric substrate has pyroelectricity. Thus, in a monolithic piezoelectric element, an increase or a decrease in temperature causes electric charges because of the pyroelectric effect.

In a piezoelectric actuator including piezoelectric layers polarized in the thickness direction, the direction of voltage caused by electric charges generated by an increase in temperature is the same as the direction of voltage applied to the piezoelectric layers during the polarization of a piezoelectric substrate. Furthermore, because the polarization in this direction is saturation polarization, electric charges generated by the pyroelectric action do not have an adverse effect.

However, the direction of voltage caused by electric charges generated by a decrease in temperature is opposite to the direction of voltage applied in polarization. Electric charges generated by the pyroelectric effect therefore undesirably decreased the degree of polarization.

In addition, the reduced degree of polarization resulting from a decrease in temperature does not return to the initial degree of polarization in response to a subsequent increase in temperature. It was found that repeated temperature changes in a monolithic piezoelectric element such as a piezoelectric actuator gradually decreases the degree of polarization. In particular, the relative dielectric constant of a piezoelectric layer is increased when the thickness of a piezoelectric layer is decreased to increase the amount of displacement, or, the amount of electric charges generated by the pyroelectric effect increases when the electromechanical coupling coefficient is increased. This tends to worsen the problems described above.

In conventional piezoelectric actuators, the piezoelectric layers are relatively thick, and the problems described above are not significantly recognized. However, as piezoelectric actuators have become smaller in recent years, the decrease in the degree of polarization caused by the pyroelectric effect has become a major issue.

The exterior resin or the covering layer for preventing migration in Patent Document 1 or Patent Document 2 can not prevent a decrease in the degree of polarization caused by the pyroelectric effect.

Patent Document 3 discloses a circuit in which a component different from a piezoelectric actuator is connected, as an electric charge leakage means, to electrodes placed at different electric potentials. Such circuitry includes a larger number of components and cannot provide a smaller device including a monolithic piezoelectric element.

It is an object of the present invention to overcome the drawbacks of known technologies and to provide a piezoelectric element that can effectively prevent migration between a plurality of internal electrodes in a monolithic piezoelectric element without the need to use another component and that can prevent a decrease in the degree of polarization resulting from the pyroelectric effect even when temperature changes are repeatedly applied to the piezoelectric element.

The present invention provides a piezoelectric element including a piezoelectric substrate and a plurality of internal electrodes in the piezoelectric substrate. The piezoelectric substrate includes a top surface, a bottom surface, and at least one side face connecting the top surface and the bottom surface. The plurality of internal electrodes is disposed parallel to the top surface and the bottom surface and is exposed at the side face. A plurality of piezoelectric layers constituting the piezoelectric substrate is stacked with the plurality of internal electrodes interposed therebetween. The plurality of internal electrodes include first internal electrodes placed at a first electric potential and second internal electrodes placed at a second electric potential, which is different from the first electric potential. The piezoelectric element further includes a first external electrode and a second external electrode each formed on the side face of the piezoelectric substrate such that the first external electrode and the second external electrode are electrically connected to the first internal electrodes and the second internal electrodes, respectively. The piezoelectric element further includes an exterior portion for preventing migration. The exterior portion covers exposed portions of the first internal electrodes and the second internal electrodes on the side face of the piezoelectric substrate. The exposed portions exclude a portion electrically connected to the first external electrode and a portion electrically connected to the second external electrode. The exterior portion contains dispersed electroconductive particles.

In a particular aspect of a piezoelectric element according to the present invention, the first internal electrodes and the second internal electrodes are alternately stacked in the thickness direction of the piezoelectric substrate.

In another particular aspect of a piezoelectric element according to the present invention, the exterior portion for preventing migration has a large thickness at a central part in which the first internal electrodes and the second internal electrodes of the piezoelectric substrate are stacked with the piezoelectric layers interposed therebetween, and has a small thickness at portions of the piezoelectric substrate outside the central part.

In still another particular aspect of a piezoelectric element according to the present invention, the exterior portion for preventing migration is a synthetic resin material composition containing a synthetic resin and electroconductive particles dispersed in the synthetic resin.

Preferably, the synthetic resin is an epoxy resin.

In still another particular aspect of a piezoelectric element according to the present invention, piezoelectric layers on both sides of each first internal electrode or each second internal electrode are polarized to expand or contract in the thickness direction and thereby constitute a piezoelectric actuator.

Advantages of the Invention

In a piezoelectric element according to the present invention, an exterior portion for preventing migration is provided to cover exposed portions of the first internal electrodes and the second internal electrodes on the side face of the piezoelectric substrate. The exposed portions exclude a portion electrically connected to the first external electrode and a portion electrically connected to the second external electrode. The exterior portion for preventing migration is formed of a resistance material for preventing migration between the first internal electrodes and the second internal electrodes. Thus, the exterior portion can prevent migration between the first internal electrodes and the second internal electrodes.

Furthermore, even when electric charges are generated by the pyroelectric effect while the piezoelectric element is subjected to repeated temperature changes, the electric charges flow out through electric current paths formed by the dispersed electroconductive particles contained in the exterior portion for preventing migration. The electric charges are therefore prevented from flowing into the piezoelectric layers. Hence, a decrease in the degree of polarization caused by the pyroelectric effect can be prevented.

The exterior portion for preventing migration is essentially an insulating portion although it contains the electroconductive particles. The exterior portion for preventing migration therefore certainly prevents migration between the first internal electrodes and the second internal electrodes.

When the first internal electrodes and the second internal electrodes are alternately stacked in the thickness direction of the piezoelectric substrate, the first internal electrodes placed at a first electric potential and the second internal electrodes placed at a second electric potential adjoin each other in the thickness direction. The exterior portion for preventing migration provided according to the present invention can prevent migration between the first internal electrodes and the second internal electrodes.

When the exterior portion for preventing migration is formed of a synthetic resin material containing electroconductive particles dispersed in a synthetic resin, the electroconductive particles can be mixed with molten synthetic resin to easily produce the intended exterior portion for preventing migration and to apply it to side faces of the piezoelectric substrate without difficulty.

In particular, the exterior portion can be applied and cured at a temperature below the Curie temperature of the piezoelectric substrate. Thus, the degree of polarization is hardly lowered. The piezoelectric substrate therefore does not need to be polarized again after the application of the exterior portion.

When the synthetic resin is an epoxy resin, the hardened material has a moderate elasticity. Thus, even when the piezoelectric element is driven for a long period of time, the exterior portion for preventing migration hardly detaches from the piezoelectric substrate.

When piezoelectric layers on both sides of each first internal electrode and each second internal electrode are polarized to expand or contract in the thickness direction and thereby constitute a piezoelectric actuator, the present invention can provide a piezoelectric actuator in which migration between the electrodes hardly occurs, a decrease in the degree of polarization hardly occurs even when the piezoelectric actuator is subjected to repeated temperature changes, and deterioration in characteristics is small over time.

BRIEF DESCRIPTION OF THE DRAWINGS

FIG. 5 is a graph illustrating changes in the rate of change in piezoelectric constant $d_{33}$ of the piezoelectric element according to the working example when the piezoelectric element is subjected to a thermal shock cycle test.

FIG. 6 is a graph illustrating changes in the rate of change in piezoelectric constant $d_{33}$ of a piezoelectric element according to a second comparative example when the piezoelectric element is subjected to a thermal shock cycle test.

FIGS. 12A and 12B are cross-sectional plan views of a piezoelectric substrate for illustrating the shape of second internal electrodes and first internal electrodes of a piezoelectric element according to another modified example of the present invention.

FIGS. 13A and 13B are cross-sectional plan views of a piezoelectric substrate for illustrating the shape of second internal electrodes and first internal electrodes of a piezoelectric element according to still another modified example of the present invention.

FIG. 15 is a perspective view of an existing piezoelectric element.

FIG. 16 is a perspective view of another existing piezoelectric element.

FIG. 17 is a perspective view of still another existing piezoelectric element.

Figure 1A:
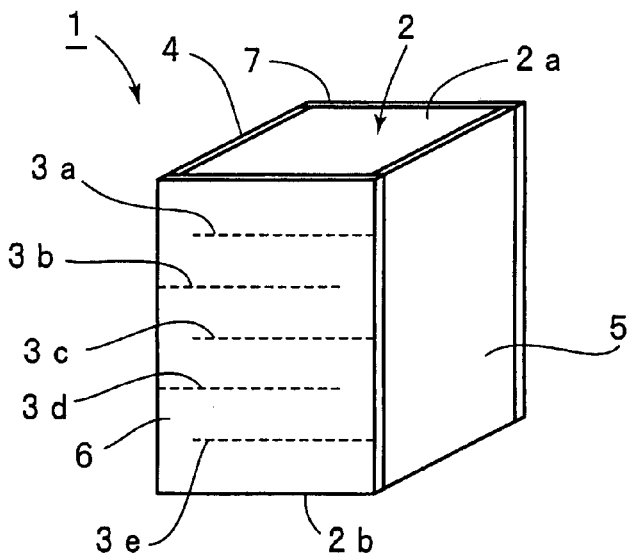
FIG. 1A is a perspective view of a piezoelectric element according to an embodiment of the present invention.

REFERENCE NUMERALS 1 piezoelectric element
2 piezoelectric substrate
2*a* top surface
2*b* bottom surface 2c first side face
2d second side face
2e third side face
2f fourth side face
3a, 3c, and 3e second internal electrodes
3b and 3d first internal electrodes
4 and 5 first external electrode and second external electrode
6 and 7 exterior portion for preventing migration
6A and 7A exterior portions
8 electroconductive particles
23a second internal electrode
23b first internal electrode
33a second internal electrode
33b first internal electrode
43a second internal electrode
43b first internal electrode
G1 gap Best Mode for Carrying Out the Invention The present invention will be further described below with the specific embodiments of the present invention with reference to the attached drawings.

FIG. 1A is a perspective view of a piezoelectric element according to a first embodiment of the present invention. A piezoelectric element 1 is a monolithic piezoelectric element and serves as an actuator.

The piezoelectric element 1 includes a piezoelectric substrate 2. As illustrated in FIG. 1C, the piezoelectric substrate 2 is a rectangular parallelepiped having a top surface 2a and a bottom surface 2b. In the piezoelectric substrate 2, the top surface 2a and the bottom surface 2b are connected with first to fourth side faces 2c to 2f. The first side face 2c faces the second side face 2d. The third side face 2e faces the fourth side face 2f.

The piezoelectric substrate 2 according to the present embodiment is formed of a piezoelectric ceramic. Examples of the piezoelectric ceramic include, but not limited to, lead zirconium titanate ceramics and lead titanate ceramics.

In the piezoelectric substrate 2, first internal electrodes 3b and 3d and second internal electrodes 3a, 3c and 3e are alternately stacked in the thickness direction. The plurality of internal electrodes 3a to 3e is parallel to the top surface 2a and the bottom surface 2b. Piezoelectric layers constitute the piezoelectric substrate 2. The internal electrodes 3a to 3e overlap one another with the piezoelectric layers interposed therebetween.

Figure 2A:
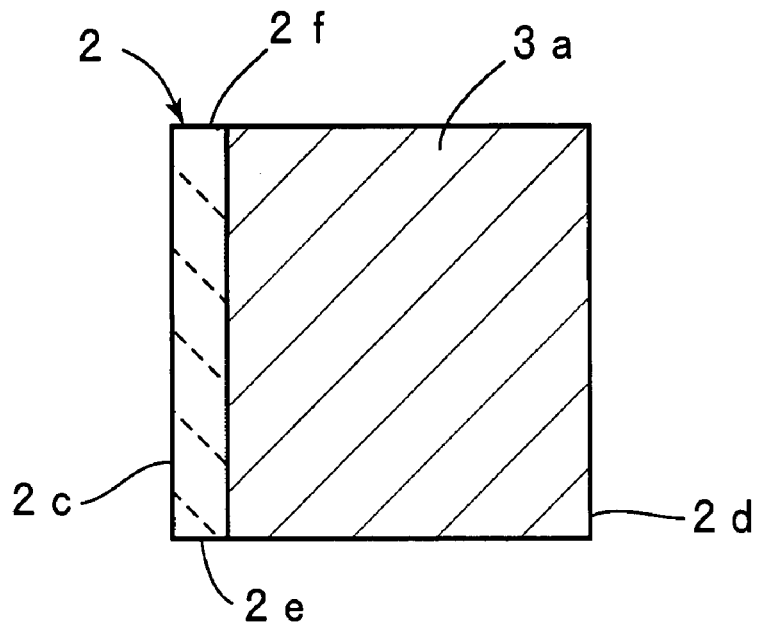
FIGS. 2A and 2B are cross-sectional plan views of a piezoelectric substrate for illustrating second internal electrodes and first internal electrodes formed in the piezoelectric substrate of the embodiment illustrated in FIG. 1A.
Figure 2B:
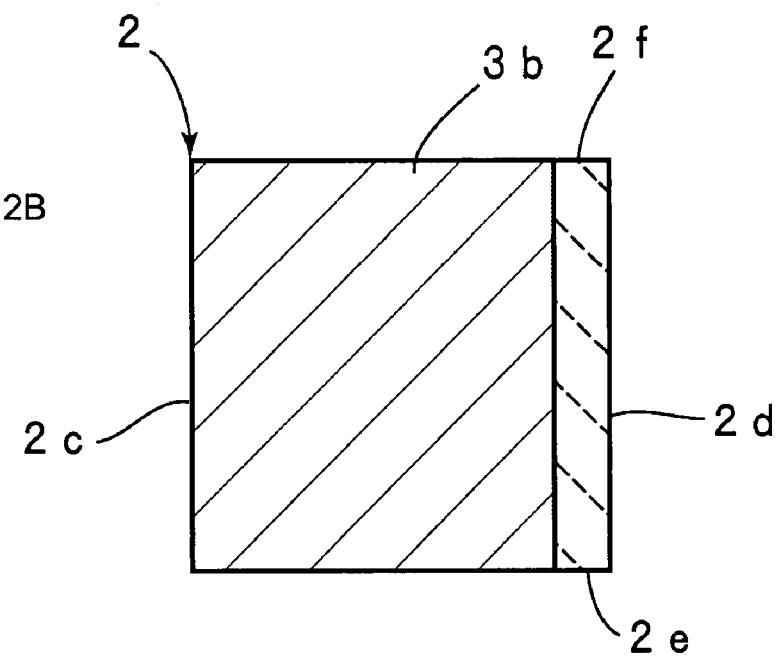

FIG. 2a is a cross-sectional plan view of the piezoelectric substrate 2 for illustrating a planar shape of the second internal electrode 3a. FIG. 2b is a cross-sectional plan view of the piezoelectric substrate for illustrating a planar shape of the first internal electrode 3b.

As illustrated in FIG. 1c, the first internal electrodes 3b and 3d protrude from the first side face 2c and do not reach the second side face 2d. In the same manner, the second internal electrodes 3a, 3c and 3e protrude from the second side face 2d and do not reach the first side face 2c.

The internal electrodes 3a to 3e are formed of an appropriate metal such as a Ag—Pd alloy or an Al alloy. In the piezoelectric substrate 2 according to the present embodiment, piezoelectric layers on both sides of the internal electrodes 3a to 3e are polarized in opposite directions in the thickness direction. A first external electrode 4 and a second external electrode 5 are formed to cover the first side face 2c and the second side face 2d. The external electrode 4 is electrically connected to the first internal electrodes 3b and 3d. The second external electrode 5 is electrically connected to the second internal electrodes 3a, 3c and 3e.

The external electrodes 4 and 5 may be formed by plating or sputtering with an electroconductive material or by hardening an electroconductive paste.

The internal electrodes 3a to 3e and the piezoelectric layers constituting the piezoelectric substrate 2 have the structure described above. The piezoelectric layers on both sides of the internal electrodes 3a to 3e are polarized in opposite directions in the thickness direction. Thus, a first electric potential and a second electric potential different from the first electric potential can be applied to the external electrodes 4 and 5 to expand and contract the piezoelectric substrate 2 in the thickness direction. Thus, the piezoelectric substrate 2 can serve as an actuator that expands and contracts in the thickness direction from the top surface 2a to the bottom surface 2b or vice versa.

A piezoelectric element 1 according to the present embodiment is characterized in that exterior portions 6 and 7 for preventing migration are formed on the third side face 2e and the fourth side face 2f, respectively, as illustrated in FIG. 1A.

Figure 1B:
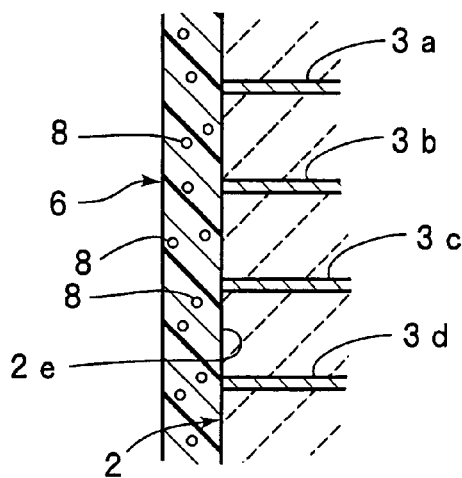
FIG. 1B is a fragmentary sectional side view of a principal part of the piezoelectric element.
Figure 1C:
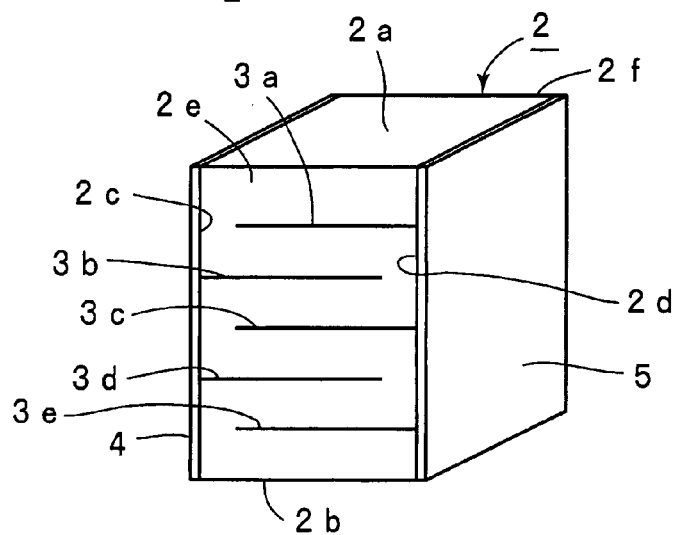
FIG. 1C is a perspective view of a piezoelectric substrate used in the embodiment.

The exterior portion 6 for preventing migration is formed of a synthetic resin material composition containing a synthetic resin and electroconductive particles 8 dispersed in the synthetic resin, as illustrated in the fragmentary sectional side view of FIG. 1B. Examples of the synthetic resin include epoxy resins, silicone resins, and polyimide resins. An epoxy resin is used in the present embodiment. A hardened epoxy resin material has an excellent moisture resistance and thereby can improve the environmental resistance. The hardened material also has a moderate elasticity and therefore hardly detaches from the outer surface of the piezoelectric substrate 2, even when the piezoelectric substrate expands and contracts.

The electroconductive particles 8 according to the present embodiment can be carbon particles. The electroconductive particles may also be metal particles such as Ag, Au or Cu, or an alloy thereof.

The degree of dispersion of the electroconductive particles 8 must be controlled to exhibit electrical resistance to prevent migration while forming an electric current path through which electric charges generated by a pyroelectric effect described below flow.

The exterior portions 6 and 7 for preventing migration are formed on the side faces 2e and 2f. The first internal electrodes 3b and 3d placed at a first electric potential and the second internal electrodes 3a, 3c and 3e placed at a second electric potential adjoin each other on the side faces 2e and 2f. The insulation resistance of the exterior portions 6 and 7 for preventing migration is designed to prevent migration between the adjacent internal electrodes or to have a sufficient insulation resistance to prevent migration.

When exposed to a temperature change, the electroconductive particles 8 form an electric current path through which pyroelectric charges generated in the piezoelectric substrate 2 flow. Thus, the electroconductive particles 8 decrease the voltage generated by the pyroelectric charges. The electroconductive particles 8 may be dispersed to achieve such performance. Thus, even when the piezoelectric substrate 2 is exposed to a temperature change, the electroconductive particles 8 can prevent a decrease in the degree of polarization resulting from the pyroelectric charges.

The exterior portions 6 and 7 for preventing migration may be formed by melting a synthetic resin, mixing electroconductive particles 8 in the synthetic resin, applying the mixture to the side faces 2e and 2f of the piezoelectric substrate 2, and curing the mixture. The exterior portions 6 and 7 for preventing migration may also be formed by any other method.

In the present working example, the whole area of the side faces 2e and 2f is coated with the exterior portions 6 and 7 for preventing migration. However, the whole area of the side faces 2e and 2f may not be coated with the exterior portions 6 and 7 for preventing migration. At least exposed portions of the internal electrodes 3a to 3e may be covered with the exterior portions 6 and 7 for preventing migration.

In the present embodiment, the side faces 2e and 2f are covered with the exterior portions 6 and 7 for preventing migration to prevent migration. In addition, the dispersed electroconductive particles 8 can dissipate an electric current generated by pyroelectric charges. Thus, the present embodiment can provide a piezoelectric element 1 that prevents a decrease in the degree of polarization and that exhibits stable characteristics over time, even when the piezoelectric element 1 is subjected to a temperature change during extended periods of use. This will be demonstrated below according to a specific example of experiment.

A piezoelectric substrate 2 was provided. In the piezoelectric substrate 2, the thickness of piezoelectric layer between electrodes was 30 μm, the number of piezoelectric layers was 70, the height of the piezoelectric layers was 2.5 mm, and the width and the depth of the piezoelectric layers were 1.2 mm. In the piezoelectric substrate 2, the distance between the tips of internal electrodes 3a to 3e and the side face 2c or 2d, on which the internal electrodes 3a to 3e were not exposed, was 0.1 mm. In other words, overlaps between the first internal electrodes 3b and 3d and the second internal electrodes 3a, 3c, and 3e were 1.0 mm in the direction perpendicular to the first side face 2c and the second side face 2d. In terms of materials used, the piezoelectric substrate 2 was formed of a PZT ceramic, the internal electrodes 3a to 3e were formed of Ag—Pd, and the external electrodes 4 and 5 were formed of a Ag thin film.

97% by weight of epoxy resin (as solid content) and 3% by weight of carbon particles serving as electroconductive particles 8 were mixed with a solvent to produce a composition. The carbon particles had a particle size of 10 μm or less and a specific gravity of 1.8. The composition was applied to side faces 2e and 2f of the piezoelectric substrate 2 and was cured, thus forming the exterior portions 6 and 7 for preventing migration having a thickness of 8 μm.

For purposes of comparison, an element according to a first comparative example was provided. This element had the same structure as the piezoelectric element 1 except that the exterior portions were not formed.

Figure 3:
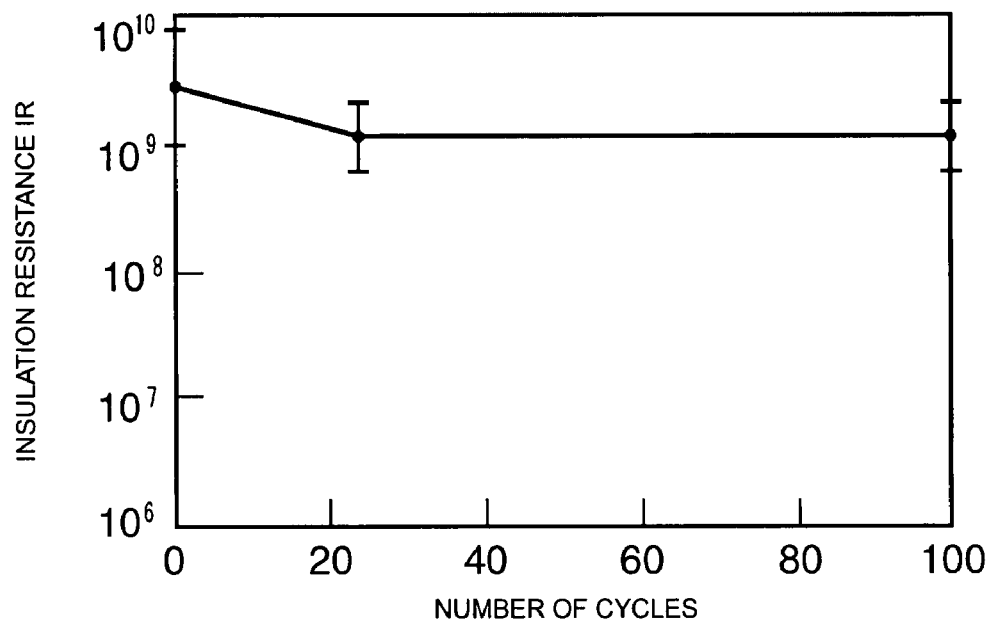
FIG. 3 is a graph illustrating changes in insulation resistance IR of a piezoelectric element according to a working example when the piezoelectric element is subjected to temperature changes.
Figure 4:
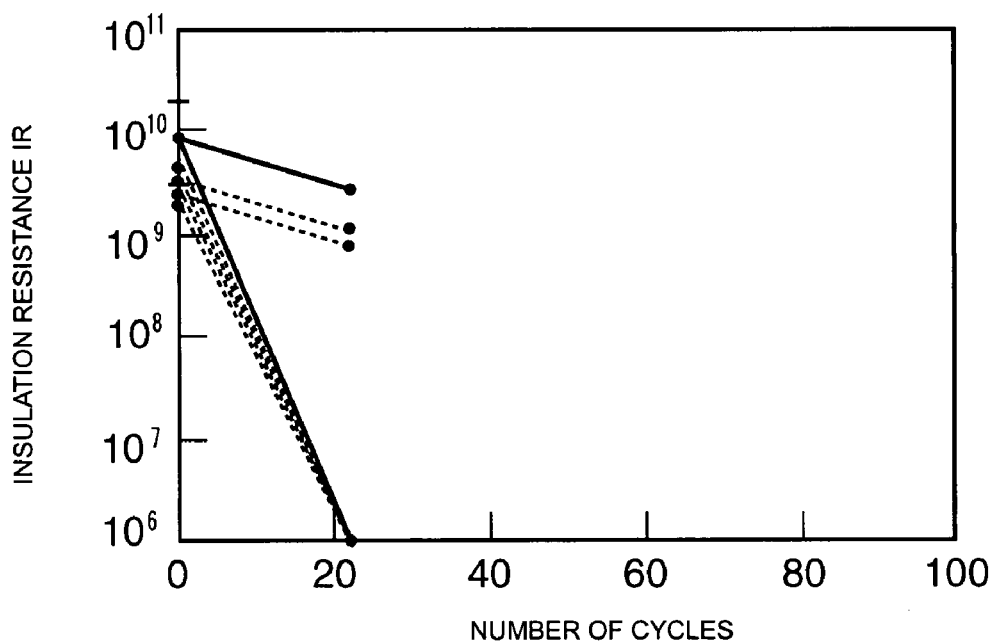
FIG. 4 is a graph illustrating changes in insulation resistance IR of a piezoelectric element according to a first comparative example when the piezoelectric element is subjected to temperature changes.

After dew was formed on the surfaces of the piezoelectric element according to the working example and the piezoelectric element according to the first comparative example, the piezoelectric elements were subjected to a temperature change. The change in insulation resistance IR was measured by passing a direct current of 4 V through the piezoelectric elements. The temperature change cycle included 5° C. and a relative humidity of 60% for 20 min and then 25° C. and a relative humidity of 90% for 20 min. This temperature change cycle was repeated. The change in insulation resistance was measured at a measuring voltage of 4 V. FIG. 3 shows the results of the working example. FIG. 4 shows the results of the first comparative example. FIGS. 3 and 4 show the results of several samples produced as described. In FIG. 3, the results of samples are expressed by the width between the maximum and the minimum for the sake of clarity.

As is clear from FIG. 3, the insulation resistance IR slightly decreased in the piezoelectric element 1 according to the working example after about 20 temperature change cycles. However, the insulation resistance IR decreased only a little afterward, in 100 cycles. This demonstrates that the anti-condensation property is improved and that migration resulting from the condensation was prevented. Furthermore, variation in the results between samples was small.

By contrast, as is clear from FIG. 4, the insulation resistance IR greatly decreased in the first comparative example after 20 cycles of temperature changes in many samples. This is because the passage of electric current caused by condensation, that is, migration drastically reduced the insulation resistance. Furthermore, decreases in the insulation resistance IR differed largely between samples.

Hence, the working example can certainly prevent migration caused by condensation.

An element according to a second comparative example was provided. This element was the same as that of the working example except that exterior portions were formed on side faces 2e and 2f using a material containing no carbon particle, that is, using only an epoxy resin.

The piezoelectric element according to the second comparative example had an insulation resistance of 1 GΩ at a measuring voltage of 4 V. On the other hand, the piezoelectric element according to the working example, which contained the carbon particles, had an insulation resistance of 100 MΩ under the same conditions. This indicates that in the exterior portions for preventing migration the carbon particles form an electrically conducting path which allows electric charges to move through the exterior portions.

The piezoelectric elements according to the working example and the second comparative example were subjected to a thermal shock test. The thermal shock test included a cycle of −40° C. for 30 min and then +85° C. for 30 min. The piezoelectric constant $d_{33}$ was determined. FIG. 5 shows the results of the working example. FIG. 6 shows the results of the second comparative example. Also in this thermal shock test of the working example and the second comparative example, many samples were measured. In FIG. 5, the results of samples are expressed by the width between the maximum and the minimum for the sake of clarity.

As is clear from FIG. 5, the piezoelectric constant $d_{33}$ of the working example was almost constant after 500 cycles. By contrast, as is clear from FIG. 6, the piezoelectric constant $d_{33}$ of the second comparative example greatly decreased as early as before 100 cycles. Furthermore, in the second comparative example, variations between samples were very large.

In the second comparative example, which corresponds to a conventional construction, the pyroelectric effect caused by a temperature change decreased the degree of polarization, and the piezoelectric constant $d_{33}$ greatly decreased as the number of cycles in the thermal shock test increased. By contrast, the piezoelectric constant $d_{33}$ of the working example was almost constant, and the rate of change in piezoelectric constant $d_{33}$ was below 5%. This indicates that the electroconductive particles dispersed in the exterior portions can effectively prevent a decrease in the degree of polarization caused by the pyroelectric effect.

Figure 7:
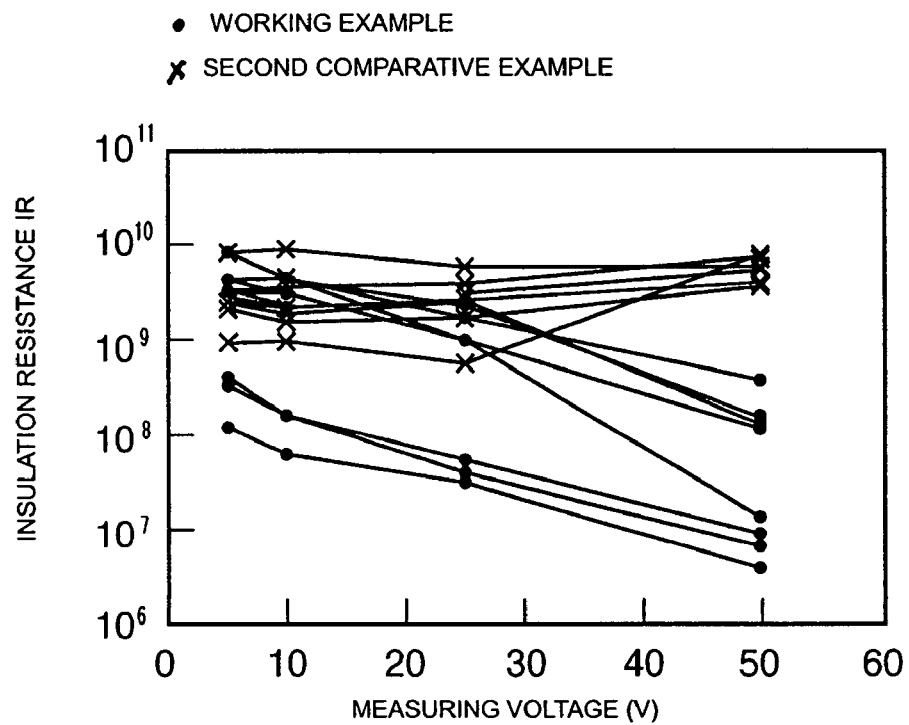
FIG. 7 is a graph illustrating the insulation resistance IR as a function of the measuring voltage in the piezoelectric elements according to the working example and the second comparative example.

FIG. 7 shows the insulation resistance as a function of the measuring voltage in the piezoelectric elements according to the working example and the second comparative example. In FIG. 7, • represents the results of the working example, and × represents the results of the second comparative example. The insulation resistance IR of the piezoelectric element according to the working example decreased with increasing measuring voltage. The driving voltage in a small actuator for use in digital camera modules is a few volts. At such a low voltage, the insulation resistance IR of the piezoelectric element according to the working example is high. At a voltage of several tens of volts, which corresponds to a pyroelectric field, the insulation resistance IR is low. When the piezoelectric element is driven, the insulation resistance of the exterior portions must be higher than the external resistance. However, at a high voltage corresponding to the pyroelectric field, the insulation resistance is desirably low. As illustrated in FIG. 7, the insulation resistance IR of the piezoelectric element according to the working example is high at a low voltage and is low at a relatively high voltage at which an electric current generated by the pyroelectric effect flows. Thus, the piezoelectric element according to the working example has a desired voltage dependence of the insulation resistance.

Figure 8:
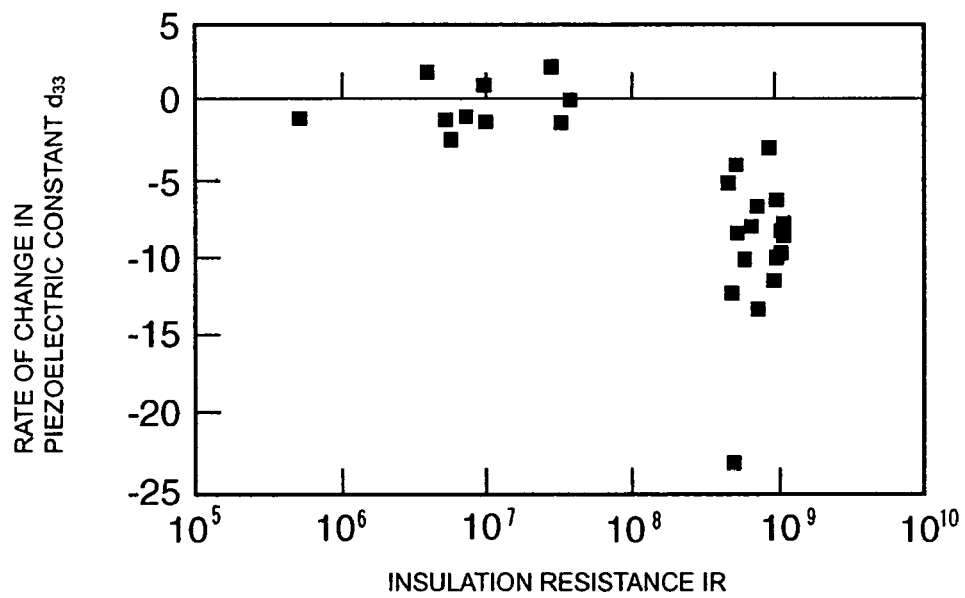
FIG. 8 is a graph illustrating the rate of change in piezoelectric constant $d_{33}$ as a function of the insulation resistance in the piezoelectric element according to the working example.

FIG. 8 shows the relationship between the insulation resistance after 100 cycles of thermal shock tests giving the results shown in FIGS. 5 and 6 and the rate of change in piezoelectric constant $d_{33}$ in the piezoelectric element according to the working example. The insulation resistance was measured at a voltage of 50 V.

As is clear from FIG. 8, lower insulation resistances IR in the present working example result in lower rates of change in piezoelectric constant $d_{33}$, thus preventing a decrease in the degree of polarization.

Figure 9:
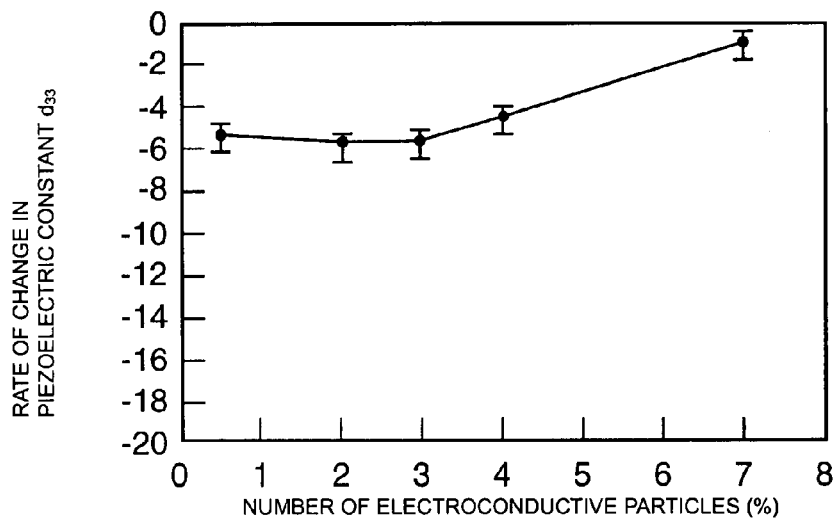
FIG. 9 is a graph illustrating the changes in the rate of change in piezoelectric constant $d_{33}$ as a function of the amount of carbon powder contained as an electroconductive powder in an exterior portion for preventing migration in the piezoelectric element according to the working example.
Figure 10:
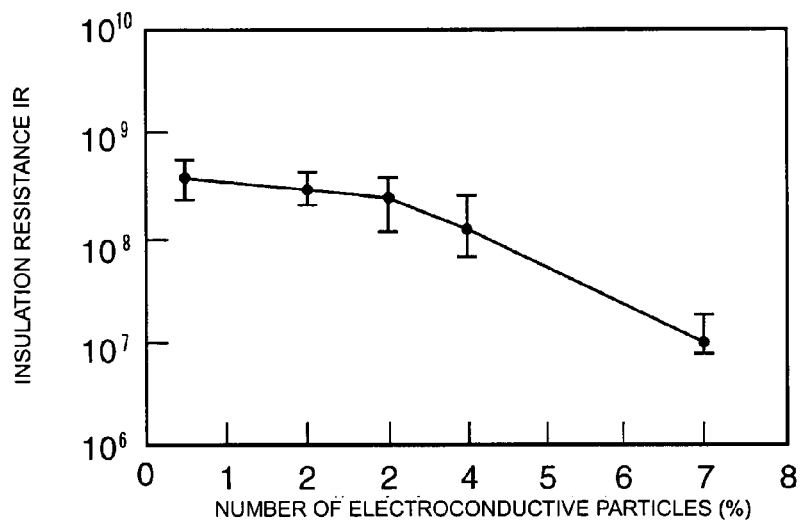
FIG. 10 is a graph illustrating insulation resistance IR as a function of the amount of carbon powder contained as an electroconductive powder in an exterior portion for preventing migration in the piezoelectric element according to the working example.

In the working example, the rate of change in piezoelectric constant $d_{33}$ and the insulation resistance IR were measured when the amount of carbon particles serving as the electroconductive particles 8 in the exterior portions 6 and 7 was 0.5% by weight, 2.0% by weight, 4.0% by weight, and 7.0% by weight, as well as 3% by weight. FIGS. 9 and 10 show the relationships between the rate of change in piezoelectric constant $d_{33}$ and the number of electroconductive particles and between the insulation resistance IR and the number of electroconductive particles.

As is clear from FIG. 9, an increase in the number of electroconductive particles results in an increase in pyroelectric resistance, thus reducing the rate of change in piezoelectric constant $d_{33}$. Indeed, the insulation resistance IR decreases with increasing number of electroconductive particles. Hence, the number of electroconductive particles is desirably small to increase the insulation resistance and is preferably large to prevent a decrease in the degree of polarization caused by the pyroelectric effect. Considering both situations, the amount of electroconductive particles is desirably 0.5 to 4.0% by weight based on the total weight of the synthetic resin and the electroconductive particles.

Figure 11A:
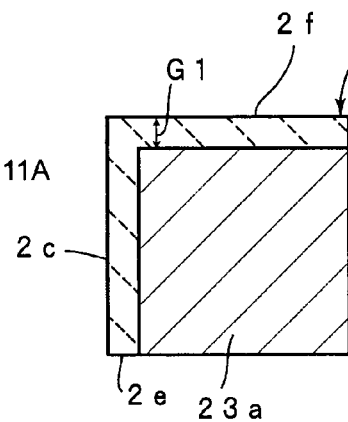
FIGS. 11A and 11B are cross-sectional plan views of a piezoelectric substrate for illustrating the shape of second internal electrodes and first internal electrodes of a piezoelectric element according to a modified example of the present invention.
Figure 11B:
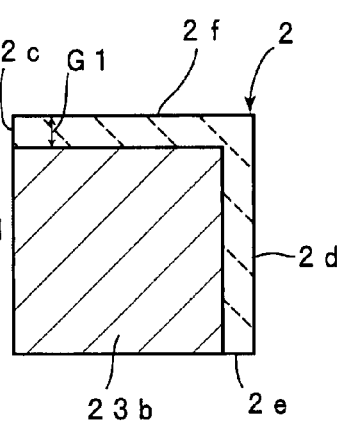

In the piezoelectric element according to the above-mentioned embodiment, the first internal electrodes and the second internal electrodes 3a to 3e are provided to be exposed at the third side face 2e and/or the fourth side face 2f. However, the internal electrodes may have various patterns as illustrated in FIGS. 11 to 13. In FIGS. 11A and 11B, a second internal electrode 23a and a first internal electrode 23b are exposed at the third side face 2e of the piezoelectric substrate 2. However, these internal electrodes are apart from the fourth side face 2f by a gap G1. In other words, an L-shaped gap G1 is provided. In this case, the exterior portion 6 for preventing migration may be provided only on the third side face 2e. The exterior portion 7 for preventing migration may not be provided on the fourth side face 2f.

As illustrated in FIGS. 12A and 12B, a second internal electrode 33a and a first internal electrode 33b may be exposed at part of the side face 2d and part of the side face 2c, respectively.

As illustrated in FIGS. 13A and 13B, a second internal electrode 43a and a first internal electrode 43b may be exposed at part of one side face 2d of the piezoelectric substrate 2. In other words, the first internal electrode and the second internal electrode may be partly exposed at one of four side faces of the rectangular parallelepiped piezoelectric substrate 2. In this case, a first external electrode and a second external electrode are formed not to be in contact with each other on the side face 2d. Thus, the first external electrode and the second external electrode are formed on one side face 2d.

Figure 14A:
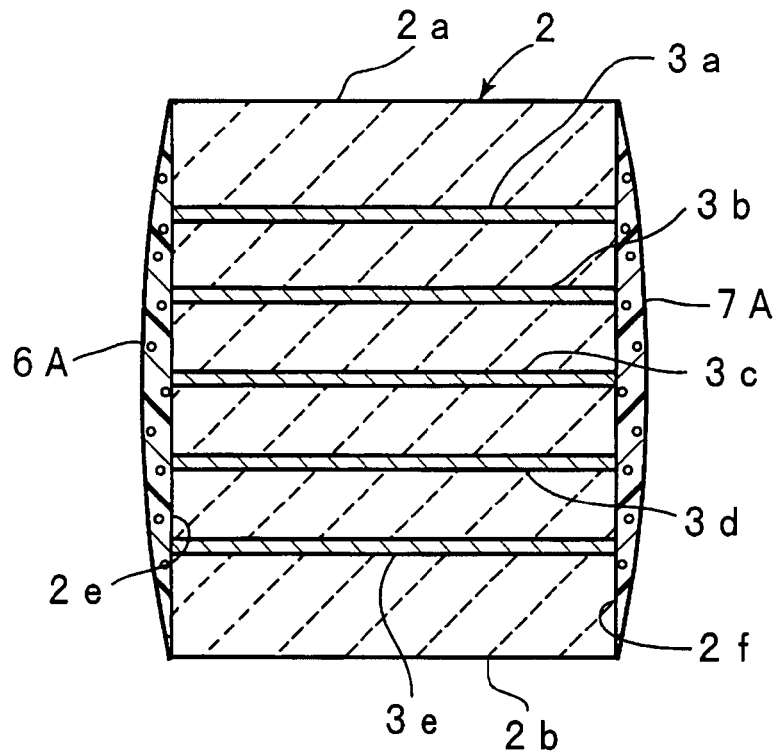
FIG. 14A is a schematic sectional side view of a piezoelectric element according to still another modified example of the present invention.

FIG. 14A is a schematic sectional side view of a piezoelectric element according to still another modified example of the present invention.

In the piezoelectric element 1 according to the embodiment illustrated in FIGS. 1A to 1C, the exterior portions 6A and 7A formed on the side faces 2e and 2f of the piezoelectric substrate 2 have a uniform thickness over the entire surface. As in a modified example illustrated in FIG. 14A, the exterior portions 6A and 7A may have a larger thickness at a central part and a smaller thickness outside the central part. The term "central part" refers to a portion where the first internal electrodes 3b and 3d and the second internal electrodes 3a, 3c and 3e placed at an electric potential different from that of the first internal electrodes overlap one another with piezoelectric layers interposed therebetween. The term "surrounding area" used herein refers to a region outside the central part in the thickness direction of the piezoelectric substrate.

When the exterior portions 6A and 7A have a smaller thickness at the surrounding area, as described above, the exterior portions 6A and 7A hardly detach from both ends in the thickness direction of the piezoelectric substrate 2. In other words, the exterior portions 6A and 7A hardly detach from boundaries between the side faces 2e and 2f and the top surface 2a and the bottom surface 2b or the neighborhood of the boundaries. Hence, a reliable piezoelectric element having reduced variations in characteristics is consistently provided.

Figure 14B:
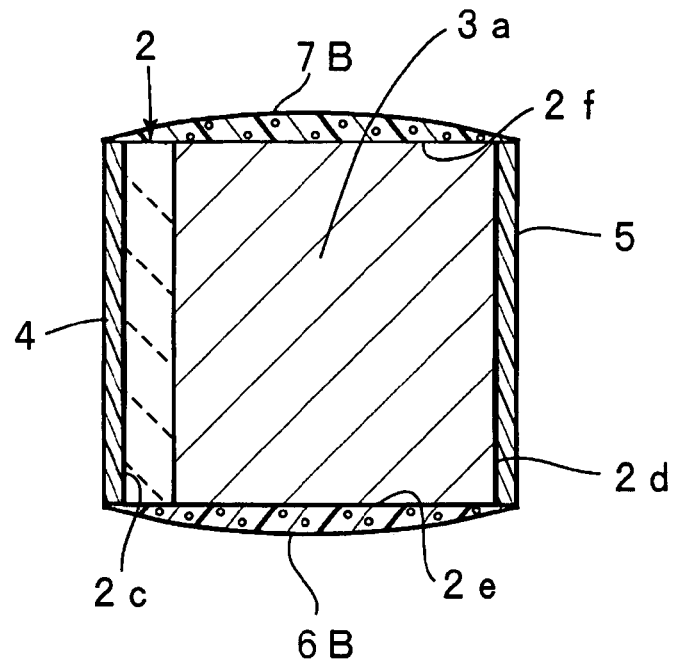
FIG. 14B is a schematic sectional plan view of this piezoelectric element.

In FIG. 14A, the surrounding area is located on the top surface 2a side and the bottom surface 2b side of the piezoelectric substrate 2 relative to the central part of the exterior portions 6A and 7A. That is, the surrounding area is located outside the central part in the vertical direction. However, the surrounding area is not limited to this area. For example, in a modified example illustrated in FIG. 14B, exterior portions 6B and 7B have a larger thickness at a central part of the side faces 2e and 2f of the piezoelectric substrate and a smaller thickness at a surrounding area of both sides in the transverse direction. The central part in FIG. 14B refers to a portion at which the first internal electrodes 3b and 3d, and the second internal electrodes 3a, 3c and 3e overlap one another between the piezoelectric layers and are exposed at the side faces 2e and 2f in FIGS. 1A and 1C. The surrounding area refers to areas located nearer the side faces 2c and 2d in relation to the central part. Such a structure in which the thickness of the exterior portions is larger at a central part and is smaller at a surrounding area may be one having a thickness distribution in the vertical direction of the piezoelectric substrate 2, one having a thickness distribution in the direction perpendicular to the side face 2c and the side face 2d, that is, in the transverse direction, or a combination thereof.

Preferably, the average thickness of the exterior portions 6A, 7A, 6B, and 7B at the central part is at least twice the average thickness at the surrounding area.

The exterior portions desirably have a certain thickness to prevent migration and to prevent a decrease in the degree of polarization caused by the pyroelectric effect. For example, the exterior portions desirably have a thickness of at least about 8 μm. On the other hand, in the surrounding area where internal electrodes placed at different electric potentials do not overlap one another with piezoelectric layers interposed therebetween, a smaller thickness of the exterior portions hardly causes migration or a decrease in the degree of polarization caused by the pyroelectric effect, thus producing no problem.

An example including a piezoelectric substrate 2 is described above. The piezoelectric substrate 2 includes internal electrodes apart from a side face by a gap. An external electrode is formed on the side face and is placed at another electric potential. The present invention can be applied to a piezoelectric element having a structure in which insulating layers are formed on a side face of a piezoelectric substrate, as illustrated in FIG. 15. As illustrated in FIG. 16, the present invention can also be applied to a piezoelectric element having a structure in which concave portions are formed on side faces of a piezoelectric substrate and the concave portions are filled with an insulating material.

In the above-mentioned embodiment, the piezoelectric substrate is a rectangular parallelepiped. However, the piezoelectric substrate may be cylindrical or discoidal and have a single cylindrical curved surface.

While the above-mentioned embodiment described a piezoelectric actuator, the present invention may widely be applied to a monolithic piezoelectric element in which internal electrodes and piezoelectric layers are stacked. The present invention can also be applied to a piezoelectric resonator.

The invention claimed is:

1. A piezoelectric element, comprising:
   a piezoelectric substrate including a top surface, a bottom surface, and at least one side face connecting the top surface and the bottom surface, and comprising
   a plurality of internal electrodes comprising at least one first and at least one second internal electrodes adapted to be place at different electric potentials, the internal electrodes disposed parallel to the top surface and the bottom surface and exposed at the side face in the piezoelectric substrate,
   a plurality of piezoelectric layers stacked with the plurality of internal electrodes such that each internal electrode is interposed between a pair of piezoelectric layers, and
   a first external electrode and a second external electrode each of which is disposed on a side face of the piezoelectric substrate such that the first external electrode and the second external electrode are electrically connected to the first internal electrodes and the second internal electrodes, respectively,
   wherein the piezoelectric element further comprises an exterior portion for preventing migration, the exterior portion covering portions of the first internal electrodes and the second internal electrodes exposed on a side face of the piezoelectric substrate, the exposed portions not including a portion which can be electrically connected to the first external and the second external electrodes, the exterior portion containing dispersed electroconductive particles.

2. The piezoelectric element according to claim 1, wherein the first internal electrodes and the second internal electrodes are alternately stacked in the thickness direction of the piezoelectric substrate.

3. The piezoelectric element according to claim 2, wherein a centrally disposed part of the exterior portion for preventing migration has a large thickness and a small thickness at portions outside the centrally disposed part.

4. The piezoelectric element according to claim 3, wherein the centrally disposed part of the exterior portion for preventing migration is defined by the area between the interior electrodes closest to the top and bottom surfaces.

5. The piezoelectric element, according to claim 4, wherein the centrally disposed part of the exterior portion for preventing migration has an average thickness which is at least double the average thickness of portions outside the centrally disposed part.

6. The piezoelectric element according to claim 5, wherein the centrally disposed part of the exterior portion for preventing migration has an average thickness of at least about 8 μm.

7. The piezoelectric element according to claim 4, wherein the exterior portion for preventing migration comprises a resin material composition comprising a synthetic resin and electroconductive particles dispersed in the synthetic resin.

8. The piezoelectric element according to claim 7, wherein the synthetic resin is an epoxy resin.

9. The piezoelectric element according to claim 8, wherein piezoelectric layers on both sides of each first internal electrode or each second internal electrode are polarized to expand or contract in the thickness direction and thereby constitute a piezoelectric actuator.

10. The piezoelectric element according to claim 9, wherein the amount of electroconductive particles is 0.5 to 4.0% by weight based on the total weight of the synthetic resin and the electroconductive particles.

11. The piezoelectric element according to claim 10, wherein the centrally disposed part of the exterior portion for preventing migration has an average thickness which is at least double the average thickness of portions outside the centrally disposed part.

12. The piezoelectric element according to claim 11, wherein the centrally disposed part of the exterior portion for preventing migration has an average thickness of at least about 8 μm, the exterior portion for preventing migration comprises a resin material composition comprising a synthetic resin and electroconductive particles dispersed in the synthetic resin.

13. The piezoelectric element according to claim 12, wherein the synthetic resin is an epoxy resin.

14. The piezoelectric element according to claim 13, wherein piezoelectric layers on both sides of each first internal electrode or each second internal electrode are polarized to expand or contract in the thickness direction and thereby constitute a piezoelectric actuator.

15. The piezoelectric element according to claim 1, wherein the exterior portion for preventing migration comprises a resin material composition comprising a synthetic resin and electroconductive particles dispersed in the synthetic resin.

16. The piezoelectric element according to claim 15, wherein the synthetic resin is an epoxy resin.

17. The piezoelectric element according to claim 16, wherein piezoelectric layers on both sides of each first internal electrode or each second internal electrode are polarized to expand or contract in the thickness direction and thereby constitute a piezoelectric actuator.

18. The piezoelectric element according to claim 1, wherein piezoelectric layers on both sides of each first internal electrode or each second internal electrode are polarized to expand or contract in the thickness direction and thereby constitute a piezoelectric actuator.

19. The piezoelectric element according to claim 1, wherein the amount of electroconductive particles is 0.5 to 4.0% by weight based on the total weight of the synthetic resin and the electroconductive particles.

20. The piezoelectric element according to claim 1 having first and second leads electrically connected to portions of the first and second external electrodes not covered by the exterior portion, respectively.

* * * * *